United States Patent [19]

Potter

[11] 4,424,492

[45] Jan. 3, 1984

[54] APPARATUS AND MEANS FOR HIGH SPEED DIGITAL FREQUENCY SHIFTING

[75] Inventor: Ronald W. Potter, Saratoga, Calif.

[73] Assignee: Hewlett-Packard Company, Palo Alto, Calif.

[21] Appl. No.: 347,113

[22] Filed: Feb. 8, 1982

[51] Int. Cl.³ .......................... H03K 5/00; H03L 7/00
[52] U.S. Cl. ................................. 328/155; 375/112; 364/900
[58] Field of Search .................. 370/102; 375/112; 328/55, 155; 307/512; 364/900

[56] References Cited

U.S. PATENT DOCUMENTS

| | | | |
|---|---|---|---|
| 3,564,414 | 2/1971 | Ebert | 375/112 |
| 3,740,655 | 6/1973 | Dickey | 307/512 |
| 3,792,360 | 2/1974 | Carlow | 328/55 |
| 4,025,720 | 5/1977 | Pachynski | 375/112 |
| 4,167,707 | 9/1979 | Gemp | 328/55 |

*Primary Examiner*—John S. Heyman
*Attorney, Agent, or Firm*—Edward Y. Wong

[57] ABSTRACT

A frequency converter for a complex digital input provides a shift of frequency without the necessity of time-consuming and expensive numerical multiplication. Furthermore, by combining the conversion process with digital filtering, the frequency of the converted output can be halved. The output can be resampled and reapplied to the novel converter for repeated shifts in frequency and reduction of bandwidth in the case of down-conversion.

7 Claims, 11 Drawing Figures

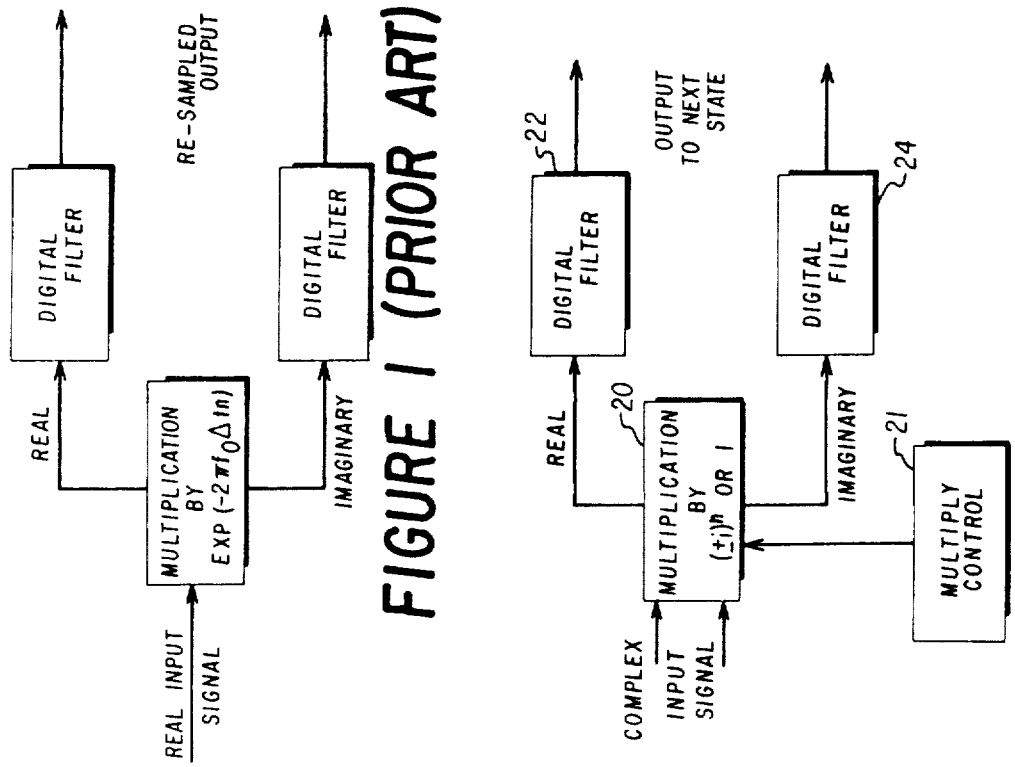

LOGIC TABLE
DOWN-CONVERSION

| n | $(-i)^n$ | INPUT | OUTPUT | $\overline{x \leftrightarrow y}$ | R+ | I+ |
|---|----------|-------|--------|---------------------------------|-----|-----|
| 0 | 1 | $x + iy$ | $x + iy$ | 1 | 1 | 1 |
| 1 | $-i$ | $x + iy$ | $y - ix$ | 0 | 1 | 0 |
| 2 | $-1$ | $x + iy$ | $-x - iy$ | 1 | 0 | 0 |
| 3 | $i$ | $x + iy$ | $-y + ix$ | 0 | 0 | 1 |
| 4 | 1 | $x + iy$ | $x + iy$ | 1 | 1 | 1 |
| 5 | $-i$ | $x + iy$ | $y - ix$ | 0 | 1 | 0 |
| 6 | $-1$ | $x + iy$ | $-x - iy$ | 1 | 0 | 0 |
| 7 | $i$ | $x + iy$ | $-y + ix$ | 0 | 0 | 1 |
| ⋮ | ⋮ | ⋮ | ⋮ | ⋮ | ⋮ | ⋮ |

$U = UP \cdot \overline{DOWN}$ $D = DOWN \cdot \overline{UP}$ $N = \overline{UP} \cdot \overline{DOWN}$

| UP | DOWN | U | D | N |
|----|------|---|---|---|
| 0 | 0 | 0 | 0 | 1 |
| 0 | 1 | 0 | 1 | 0 |
| 1 | 0 | 1 | 0 | 0 |
| 1 | 1 | 0 | 0 | 0 |

$\overline{A \oplus B} = C$

| A | B | C |
|---|---|---|
| 0 | 0 | 1 |
| 0 | 1 | 0 |
| 1 | 0 | 0 |
| 1 | 1 | 1 |

FIGURE 3C

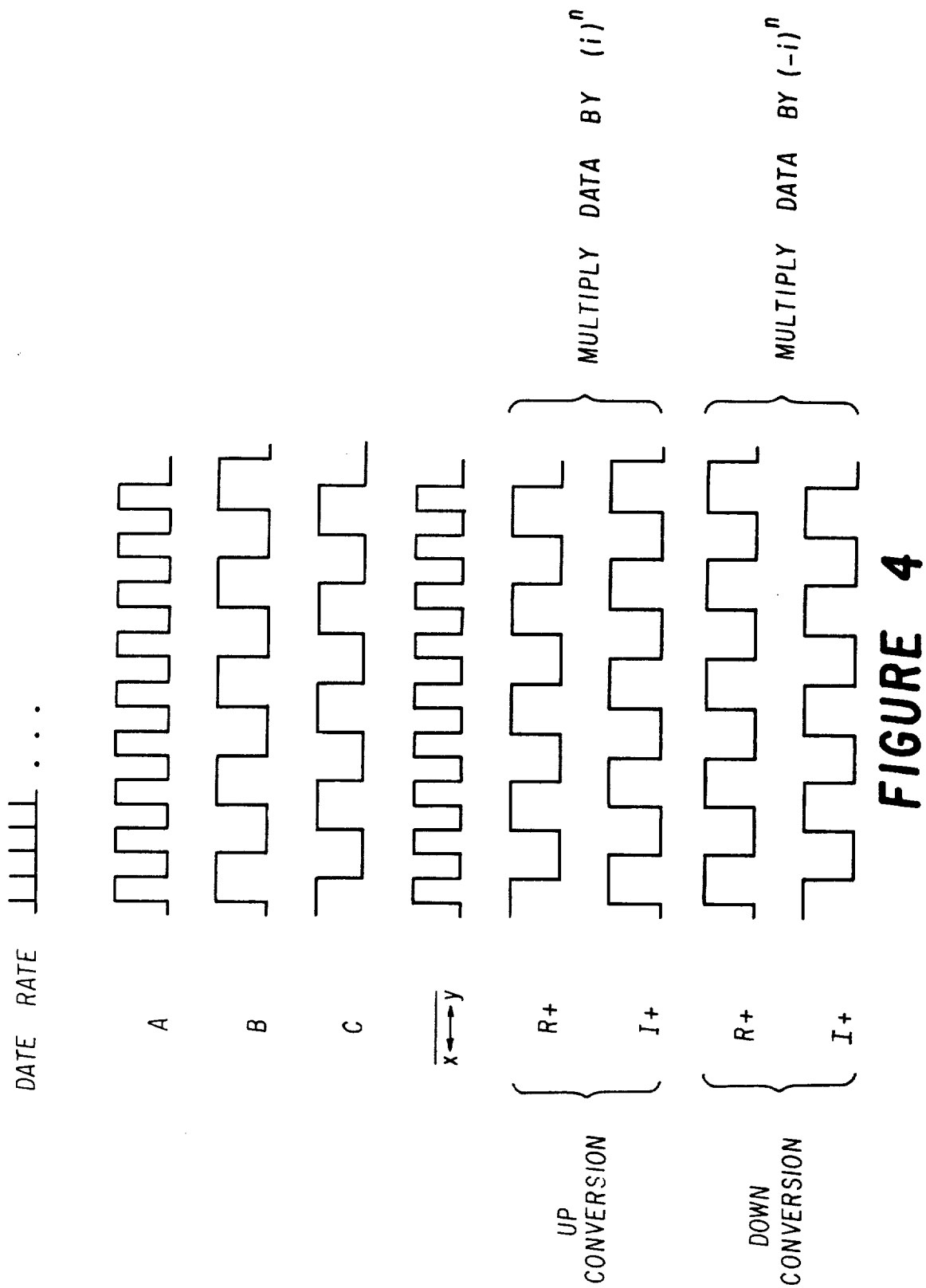

APPARATUS AND MEANS FOR HIGH SPEED DIGITAL FREQUENCY SHIFTING

BACKGROUND AND SUMMARY OF THE INVENTION

The present invention involves an apparatus and a method for digitally up- or down-converting, or frequency-shifting, the spectrum of a sampled waveform in the time domain. This frequency conversion is achieved without the use of time-consuming multiplication operations.

In the prior art, a conventional method of frequency-shifting a sampled digital signal involves multiplying each sample point by a complex exponential expression $\exp(-i2\pi f_o t)$, where $f_o$ is the desired amount of shift in frequency. Based on Euler's identities, this multiplication by the exponential expression is equivalent to a multiplication by $\sin(2\pi f_o t)$ and $\cos(2\pi f_o t)$.

If high speed operation is desired, this approach of sine and cosine multiplication unfortunately becomes very expensive; higher speed devices are required to overcome the added complexity of the circuit required for digital numerical multiplication, thus presenting a formidable disadvantage. And because sine and cosine values are needed in the multiplication, either a table of these values must be made available for retrieval during the multiplication, or a means for calculating them be made part of the circuitry. As is evident, this requirement further complicates the system and presents a further disadvantage. Because of these disadvantages, a wider use of high speed digital conversion has hitherfore not been practical.

A high speed converter in accordance with the present invention overcomes these disadvantages to the frequency converters in the prior art. Specifically, the preferred embodiment overcomes the disadvantages associated with the requirement of numerical multiplications in the conversion process; the preferred embodiment replaces all numerical multiplications with either a simple sign change or an interchange of real and imaginary values, or both, to effect a frequency shift equal to one-half of the maximum frequency of the digital input comprising a series of samples of an analog signal. This process is equivalent to multiplying the digital input with $(\pm i)^n$, where n represents the nth sample in the input signal, and the positive or negative sign of i represents an up- or down-conversion, respectively.

With an elimination of all numerical multiplications, the circuits of the preferred embodiment becomes greatly simplified and hence can operate at high speeds. Furthermore, because no numerical multiplication is required, values of sine and cosine are also not required. Hence, the need for having a sine-cosine table available or a calculation circuit for determining these values is also dispensed with.

Another advantage to the preferred embodiment due to the obviation of numerical multiplication is the lack of a need for numerical rounding off operations during the conversion process. Hence, there are no additional errors introduced by rounding-off operations as in the prior art. Furthermore, since digital down conversion usually requires subsequent low-pass filtering, the preferred embodiment in accordance with the invention allows combining low-pass filtering with the downward frequency shift to offer yet another advantage.

BRIEF DESCRIPTION OF THE DRAWINGS

FIG. 1 shows a typical converter in the prior art.

FIG. 2 shows a block diagram of the converter in accordance with the invention.

FIGS. 3B and 3C show logic tables to effectuate the converter in accordance with the invention.

FIG. 4 shows a timing diagram of the inputs in accordance with the logic tables of FIGS. 3B and 3C.

DETAILED DESCRIPTION

In multiplying a time domain function by $\exp(-i2\pi f_o t)$, the function's equivalent frequency spectrum is shifted to the left by $f_o$ along the frequency axis. In a sampled data system, time can be represented in discrete form as $n\Delta t$, where $\Delta t$ is the sample spacing, and n is a positive integer. Thus, $\exp(-i2\pi f_o t)$ becomes $\exp(-i2\pi f_o n\Delta t)$. To eliminate numerical multiplications, $f_o \Delta t$ is made equal to $\frac{1}{4}$. For this case, $$\exp(\pm i2\pi f_o t) = \exp(\pm i2\pi f_o n\Delta t)$$
$$= \exp(\pm i\pi/2)^n$$
$$= (\pm i)^n.$$

Thus, it is possible to shift a frequency spectrum along the frequency axis by $\pm 1/(4\Delta t) = \pm(\frac{1}{2})f_{max}$, where $f_{max} = 1/(2\Delta t)$, simply by multiplying the equivalent time waveform by $(\pm i)n$.

Figure 3A:
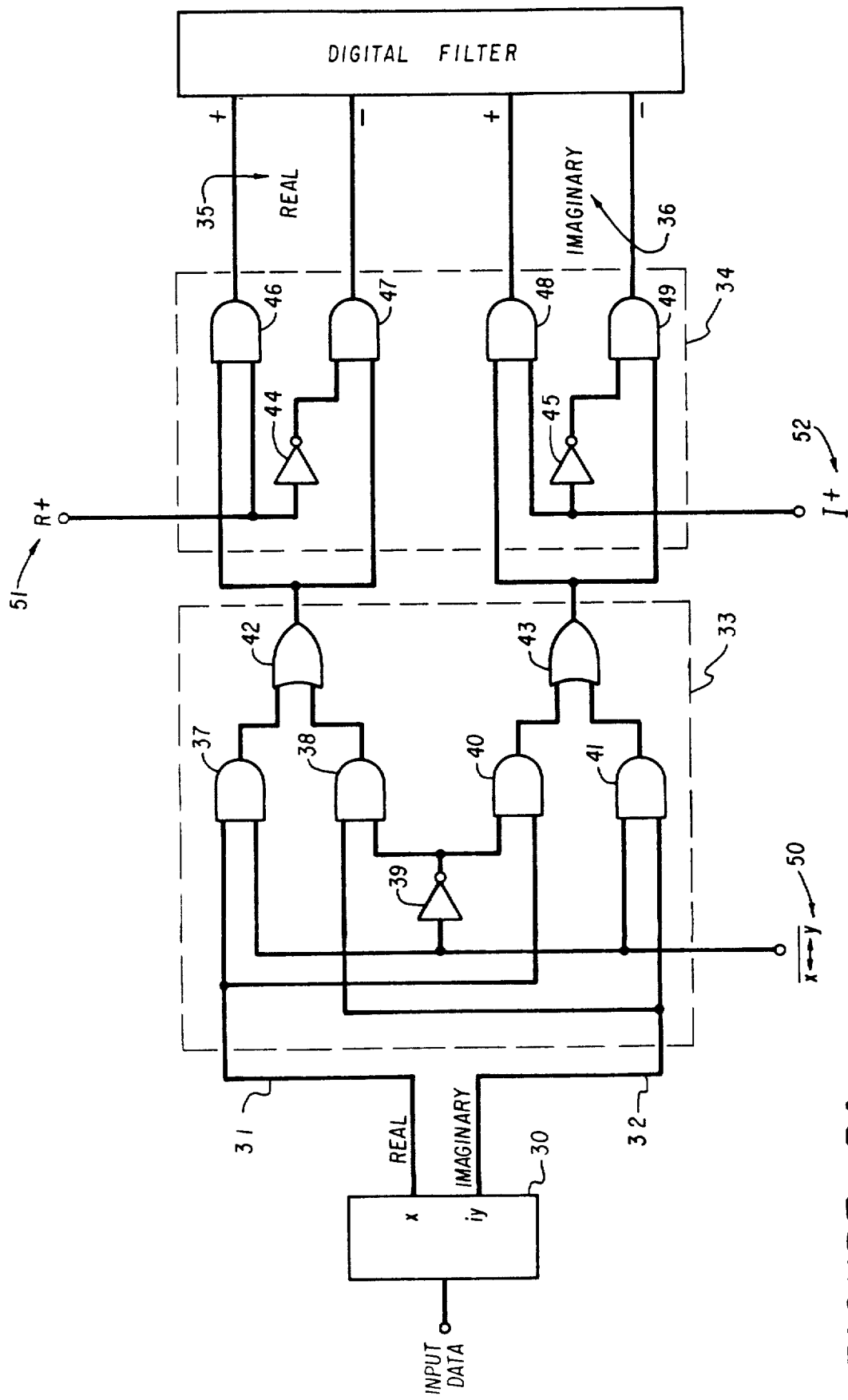
FIG. 3A shows the preferred embodiment in accordance with the invention.

A converter in accordance with the invention is illustrated in FIG. 3A. Therein, two input ports, one 31 for the real part of a complex input signal and the other 32 for the imaginary part, receive a complex input signal and allows the converter circuit to process it by effectively multiplying it with $(i)^n$ for up conversion or $(-i)^n$ for down conversion. The required conversion steps are illustrated in FIGS. 3B and 3C, where logic tables of the conversion sequence are shown. For up-conversion, $(i)^n$ is multiplied with the input signal $x+iy$, where x is the real part and y is the imaginary part. As the samples progress from $n=0$, $(i)^n$ varies as 1, i, $-1$, $-i$, etc. FIG. 4 illustrates the relative timing of the logic states. The "one" states can be characterized as no interchange of real and imaginary parts ($\overline{x \leftarrow\!\!\rightarrow y}$), no change of sign for the real part (R+), and/or no change of sign for the imaginary part (I+). These characterizations are shown in their respective columns in the logic tables of FIG. 3B, where a "one" indicates "no change." Similarly, the tables of FIG. 3C illustrate the required logic for implementing a down-conversion.

The illustrated embodiment of FIG. 3A accomplishes the required logic conversions to effect a "multiplication" of the input $x+iy$ with the factor $(\pm i)^n$ in accordance with the logic tables of FIGS. 3B and 3C. By feeding in the appropriate logic states of $\overline{x \leftarrow\!\!\rightarrow y}$, R+, and I+, the phasing of which is shown in the timing diagrams of FIG. 4, an up/down conversion is achieved.

In the illustrated embodiment, essentially two channels are present: one for the real part and one for the imaginary part. Combinations 33 of AND and OR logic gates interchange the real and imaginary parts of the input signal whenever the interchange control signal x←→y goes to zero; whenever the x←→y control signal is "one," no interchange takes place and the respective parts are transmitted along its channel to the next section where the proper sign of the real and imaginary parts are imparted. This is done through the R+ and I+ sign control inputs to a set of logic gates 34. The final outputs from the two channels are then the real and imaginary parts 35, 36 of an input x+iy which is up- or down-converted.

In the illustrated embodiment, the real part of the input sample is coupled to two AND gates 37, 40, and the imaginary part is coupled to two other AND gates 38, 41. An interchange control signal x←→y is also coupled to AND gates 37 and 41, and the complement of the control signal x←→y is coupled to AND gates 38 and 40. The outputs of gates 37 and 38 are in turn coupled to an OR gate 42, which provides the real part of a complex input whose complex parts are selectively interchanged. The outputs of gates 40 and 41 are coupled to an OR gate 43, which provides the imaginary part of a complex input whose complex parts are selectively interchanged.

The output of OR gate 42 is then coupled to AND gates 46, 47; one gate 46 also has a sign control signal R+ as an input, and the other 47 has the complement of R+ as an input. The outputs of these gates 46, 47 provide an output representing the real part of a sample of the input signal which may be shifted in frequency by one-half of the input signal's maximum frequency.

Corresponding to the above real part output, the output of OR gate 43 is coupled to AND gates 48, 49; one gate 48 also has a sign control signal I+ as an input, and the other 49 has the complement of I+ as an input. The outputs of these gates 48, 49 provide an output representing the imaginary part of a sample of the input signal which may be shifted in frequency by one-half of the input signal's maximum frequency.

Figure 5:
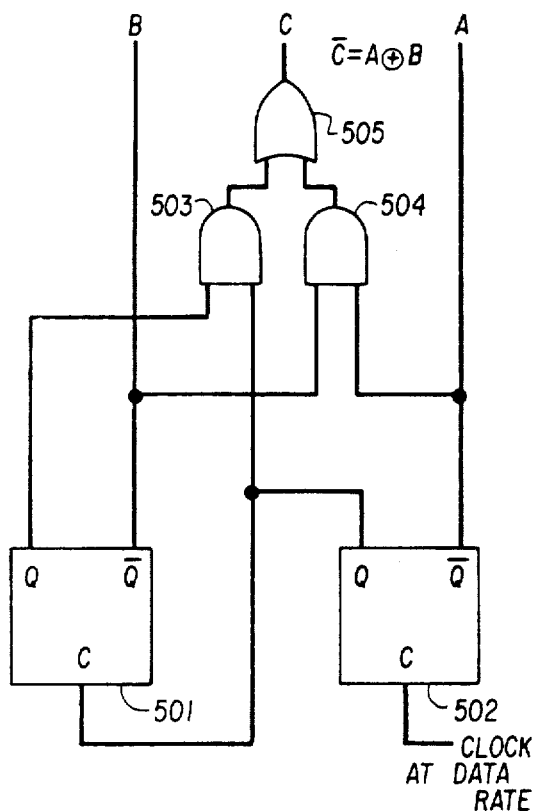
FIGS. 5-9 show preferred embodiments for obtaining the various logic inputs in accordance with the logic tables of FIGS. 3B and 3C and the timing diagram of FIG. 4 for the illustrated embodiment of the invention.
Figure 6:
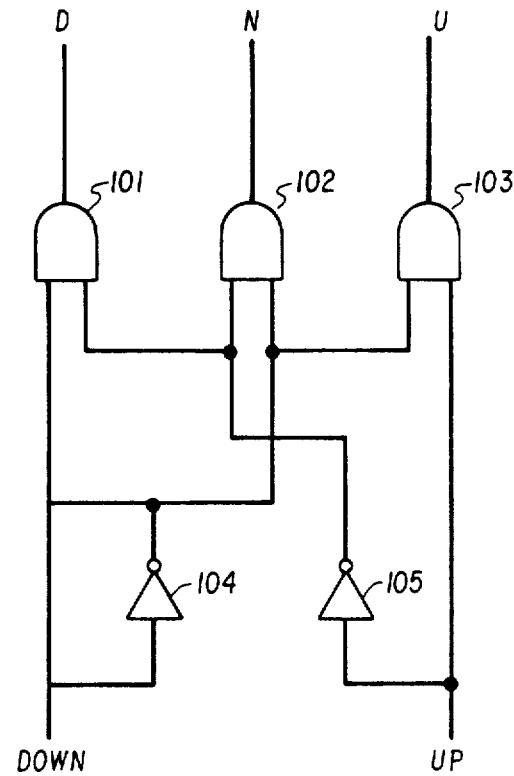
Figure 7:
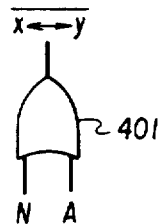
Figure 8:
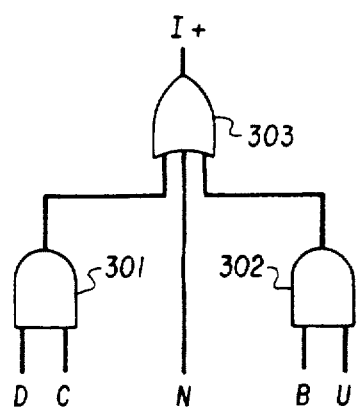
Figure 9:
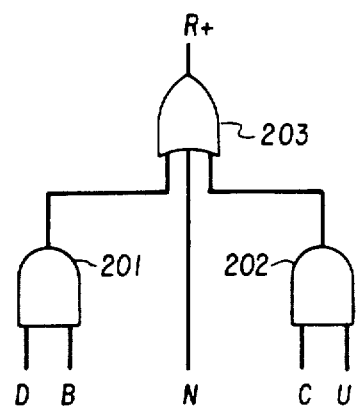

Data enters the preferred embodiment at a selected frequency. This frequency then determines the clock rate for the logic circuits illustrated in FIGS. 5–9. The logic circuit in FIG. 5 divides the input clock rate to yield control signals A, B, and C, where A, B, and C are related as shown in FIG. 4. Control signals D, N, and U are obtained, for example, by the logic circuit shown in FIG. 6. These control signals, in combination with control signals A, B, and C, are applied to the logic circuits contained in FIGS. 8–9 to obtain the real and imaginary sign control signals R+ and I+. Then by controlling the converter circuit of FIG. 3A with these control signals R+ and I+, along with the interchange control signal x←→y derived from the logic circuit of FIG. 7, the frequency of the coupled input signal is shifted by one-half of its maximum frequency.

For down-conversion, the bandwidth of the partially down-converted signal can be reduced by passing the converted signals through digital filters that follow the converter. The filtered output can then be re-sampled at half the input rate, thus resulting in a new time waveform with a shifted frequency spectrum and with its maximum frequency halved. This process of down-converting and filtering can be repeated until the desired bandwidth is achieved.

An added advantage to the present invention is that at any stage in the repeated down-conversion and filtering process, it is possible to resort to the conventional down-conversion scheme of multiplying by $\exp(-i2\pi f_0 \Delta tn)$. This allows the final frequency shift to be set precisely to the desired value with the minimum amount of digital numerical multiplication and concomitant expense and delay. If this conventional conversion is made just prior to the last stage of filtering and resampling, then the final bandwidth of the down-converted signal will not be halved, as it would have been otherwise with no numerical multiplication in accordance with the present invention.

I claim:

1. A method of frequency shifting a digital input signal separated into its complex components of a real part and an imaginary part comprising the steps of:
   sampling said input signal at a predetermined rate to obtain n samples, n being an integer; and
   digitally processing each of said samples substantially only by equivalently multiplying said sample by one of $(i)^n$ $(-i)^n$, where n corresponds to the nth sample and i is the square root of $-1$.

2. The method as in claim 1 further comprising the steps
   digitally filtering the real part of said samples to halve the sample bandwidth;
   digitally filtering the imaginary part of said samples to halve the sample bandwidth; and
   resampling said filtered parts at half the first sampling rate.

3. An apparatus for frequency-shifting a digital input signal comprising:
   input port for separating said digital input signal into a real part and an imaginary part;
   interchange means coupled to said input port for selectively interchanging the values of said real and imaginary parts; and
   sign means coupled to said interchange means for selectively changing the signs of said real and imaginary parts to produce an output real part and an output imaginary part of a digital output signal whose frequency is shifted from that of said digital input signal.

4. The apparatus as in claim 3 further comprising:
   a first digital filter coupled to said sign means, said first digital filter having said output real part as an input signal; and
   a second digital filter coupled to said sign means, said second digital filter having said output imaginary part as an input signal.

5. The apparatus as in claim 3 or 4, wherein said interchange means comprises:
   a real input port for receiving said real part;
   an imaginary input port for receiving said imaginary part;
   an interchange control signal for selectively interchanging values of said real and imaginary parts;
   a first gate having said real part and said interchange control signal as inputs to produce a first output signal;
   a second gate having said imaginary part and said interchange control singal as inputs to produce a second output signal;
   a third gate having said imaginary part and further the complement of said interchange control signal as inputs to produce a third output signal;
   a fourth gate having said real part and further the complement of said interchange control signal as inputs to produce a fourth output signal;
   a fifth gate having said first and third output signals as inputs signals to produce a real part of a complex interchange output signal; and a sixth gate having said second and fourth ouput signals as input signals to produce an imaginary part of said complex interchange output signal.

6. The apparatus as in claim 5, wherein said sign means comprises:
- a first sign control signal for selectively changing the sign of said real part of said interchange output signal;
- a second sign control signal for selectively changing the sign of said imaginary part of said interchange output signal;
- a seventh logic gate having said real part of said interchange output signal and said first sign control signal as inputs to produce a first polarity of the real part of said frequency-shifted digital output signal;
- an eighth logic gate having said real part of said interchange output signal and the complement of said first sign control signal as inputs to produce a second polarity of the real part of said frequency-shifted digital output signal;
- a ninth logic gate having said fourth imaginery part of said interchange output signal and said second sign control signal as inputs to produce a first polarity of the imaginary part of said frequency-shifted digital output signal; and
- a tenth logic gate having said imaginary part of said interchange output signal and the complement of said second sign control signal as inputs to produce a second polarity of the imaginary part of said frequency-shifted digital output signal.

7. The apparatus as in claim 3 or 4, wherein said sign means comprises:
- a first sign control signal for selectively changing the sign of said real part from said interchange means;
- a second sign control signal for selectively changing the sign of said imaginary part from said interchange means;
- a seventh logic gate having said real part and said first sign control signal as inputs to produce a first polarity of the real part of said frequency-shifted digital output signal;
- an eighth logic gate having said real part and the complement of said first sign control signal as inputs to product a second polarity of the real part of said frequency-shifted digital output signal;
- a ninth logic gate having said imaginery part and said second sign control signal as inputs to produce a first polarity of the imaginary part of said frequency-shifted digital output signal; and
- a tenth logic gate having said imaginery part and the complement of said second sign control signal as inputs to produce a second polarity of the imaginary part of said frequency-shifted digital output signal.

* * * * *

UNITED STATES PATENT AND TRADEMARK OFFICE
CERTIFICATE OF CORRECTION

PATENT NO. : 4,424,492
DATED : January 3, 1984
INVENTOR(S) : Ronald W. Potter

It is certified that error appears in the above—identified patent and that said Letters Patent is hereby corrected as shown below:

Column 2, line 34, "($\pm$i)n." should read -- $(\pm i)^n$. --;

Column 4, line 16, "$(i)^n$ $(-i)^n$" should read -- $(i)^n$ and $(-i)^n$ --;

Column 4, line 19, after "steps" insert -- of:--;

Column 4, line 57, "singal" should read -- signal --;

Column 5, line 1, "ouput" should read -- output --;

Column 5, line 22, delete -- fourth -- .

Signed and Sealed this

Twenty-seventh Day of March 1984

[SEAL]

Attest:

GERALD J. MOSSINGHOFF

Attesting Officer     Commissioner of Patents and Trademarks